(12) United States Patent
Delpech et al.

(10) Patent No.: US 6,469,363 B1
(45) Date of Patent: Oct. 22, 2002

(54) INTEGRATED CIRCUIT FUSE, WITH FOCUSING OF CURRENT

(75) Inventors: Philippe Delpech, Meylan (FR); Nathalie Revil, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/304,919

(22) Filed: May 4, 1999

(30) Foreign Application Priority Data

May 7, 1998 (FR) .............................................. 98 05742

(51) Int. Cl.[7] .............................................. H01L 29/00
(52) U.S. Cl. .................... 257/529; 438/132; 438/215; 438/281; 438/333; 438/467; 438/601
(58) Field of Search ................................ 257/528, 529; 438/132, 215, 281, 333, 467, 601

(56) References Cited

U.S. PATENT DOCUMENTS

| | | | |
|---|---|---|---|
| 5,444,287 A | * | 8/1995 | Bezama et al. ............. 257/467 |
| 5,572,050 A | * | 11/1996 | Cohen ........................ 257/209 |
| 5,659,182 A | * | 8/1997 | Cohen ......................... 257/50 |
| 5,708,291 A | * | 1/1998 | Bohr et al. ................. 257/529 |
| 5,798,534 A | * | 8/1998 | Young ......................... 257/59 |

FOREIGN PATENT DOCUMENTS

| | | | | |
|---|---|---|---|---|
| JP | 2-186660 | * | 7/1990 | ........... H01L/21/82 |

* cited by examiner

Primary Examiner—Olik Chaudhuri
Assistant Examiner—Wai-Sing Louie
(74) Attorney, Agent, or Firm—Lisa K. Jorgenson; Allen, Dyer, Doppelt, Milbrath & Gilchrist, P.A.

(57) ABSTRACT

An integrated circuit fuse is formed on a substrate by etching a polysilicon, metal or alloy layer deposited thereon to include a central region, at the end of which are zones with electrical contacts. The central region has at least two first electrically parallel arms. A zone of intersection of the first two arms forms a point for focusing a fusing current which facilitates the fusing of the fuse by increasing local current density flowing through the integrated circuit.

19 Claims, 2 Drawing Sheets

INTEGRATED CIRCUIT FUSE, WITH FOCUSING OF CURRENT

FIELD OF THE INVENTION

The present invention relates to the field of integrated circuits and, more particularly, to an integrated circuit fuse.

BACKGROUND OF THE INVENTION

Forming fuses in integrated circuits is a practice well-known to those skilled in the art, especially in the manufacture of metal oxide semiconductor (MOS) circuits. For example, it is standard practice to form fuses to protect MOS transistor gates against the accumulation of electrostatic charges that appear during the manufacture of integrated circuits. These fuses are then disrupted or fused to release the gates of the transistors. Providing redundant word lines or bit lines in large capacity memories also rely on the use of fuses. The defective or unnecessary and redundant lines are then cut off from the rest of the memory by the fusing or disrupting of fuses.

Thus, in general, the fuses present in integrated circuits are designed to be fused by the application of a fusing voltage or current which enables modification of the configuration of a circuit at a final stage of manufacture.

A prior art fuse 1 of the type shown in FIG. 1 includes a central region 2 in the shape of a small bar that widens out at its ends to form two zones 3, 4 receiving a plurality of electrical contacts 5, 6. In general, as can be seen in FIG. 2 in a sectional view, the fuse 1 is buried in an integrated circuit 10 where it is sandwiched between a lower oxide layer 11 and an upper oxide layer 12 that are deposited on a silicon substrate 13. The contacts 5, 6 take the form of metallized holes going through the oxide layer 12 to connect the zones 3, 4 to respective conductors 14, 15. The whole unit is made in a standard way by the successive deposition of various layers of oxide, metal and/or polysilicon, and by the etching of the layers by photolithography.

In order that the current density in the fuse 1 and the efficiency of the fusing may be a maximum for a given fusing current, the width W of the central region 2 of the fuse is usually chosen to be equal to the minimum width $W_{min}$ permitted by the manufacturing technology of the integrated circuit 10. For example, at present, a minimum width $W_{min}$ of a conductor for MOS type integrated circuits is commonly about 0.25 micrometers.

However, this precaution provides only a relative advantage, given that the minimum width determines the size of the other components present in the integrated circuit 10. This is particularly so for transistors, and their capacity to withstand high voltages or currents. Thus, in recent years, the reduction of the minimum width of a conductor as a result of advancements in manufacturing technology has gone hand in hand with a reduction in the permissible fusing voltages and currents. For example, the maximum fusing voltages permitted in medium-scale integrated MOS circuits according of the prior art technology were in the range of 5.5 to 6 volts. Today, large-scale integrated circuits using the most current technology have maximum fusing voltages of no more than 1.8 to 2 volts.

Thus, despite providing for a minimum width, a standard fuse does not, in statistical terms, provide a fusing efficiency equal to 100% under standard fusing conditions. In other words, to simultaneously fuse or disrupt a set of fuses present in an integrated circuit by applying one or more fusing pulses of current or voltage, it frequently happens that non-disrupted fuses remain. These fuses have an electrical resistance which, although it is higher than their initial electrical resistance, cannot be equal to that of an open circuit.

This drawback effects the efficiency in the manufacture of the integrated circuits, and becomes a significant problem when several tens, or even several hundreds of fuses are formed in the same integrated circuit. Another drawback of standard fuses is that they are not entirely reliable. A certain percentage of disrupted fuses have a tendency to regenerate, for reasons as yet poorly explained. In practice, the regeneration of a fuse is expressed by the fact that its electrical insulation properties deteriorate, whereas they were initially satisfactory.

Finally, the fusing current that can be applied to a fuse without going beyond a given fusing voltage is limited by the presence of parasitic resistors forming an access resistance to the fuse. It is known that the access resistance of a fuse includes the resistance of the electrical contacts 5, 6, which is generally in the range of 5Ω per contact, and the resistance of the zones 3, 4 between the contacts and the central region. The increase in the number of contacts makes it possible to reduce the access resistance. However, the number of contacts that can be planned remains limited by the small width of the central region 2 and the distribution of the current in the zones 3, 4. In other words, the widening of the zones 3, 4 to add yet additional contacts would not modify the access resistance.

SUMMARY OF THE INVENTION

An objective of the present invention is to provide an integrated circuit fuse that is fused more easily than a standard prior art fuse. An integrated circuit fuse according to the present invention reduces the fusing voltage applied to the terminals of the fuse, which correlates with the trend towards reducing supply voltages of integrated circuits.

Another object of the present invention is to provide an integrated circuit fuse that has increased fusing efficiency and reliability as compared to standard fuses.

Yet another object of the present invention is to provide an integrated circuit fuse with low access resistance.

These objects are achieved by providing an integrated circuit fuse formed on a substrate by etching a layer of polysilicon, metal or alloy to include a central region, at the end of which are zones with electrical contacts. The central region has at least two first electrically parallel arms. A zone of intersection of the first two arms forms a point for focusing a fusing current which facilitates the fusing of the fuse by increasing the local current density.

According to one embodiment, the central region includes, beyond the intersection zone, two second arms positioned as a prolongation of the first two arms. Depending on the chosen embodiment, the arms may be arranged at right angles, and/or have the same length, and/or have the same width. Preferably, the arms have a width equal to a minimum width according to current manufacturing standards available for manufacturing integrated circuit fuses.

BRIEF DESCRIPTION OF THE DRAWINGS

The objects, features and advantages as well as others of the present invention shall be explained in greater detail in the following description of an exemplary embodiment of an integrated circuit fuse according to the present invention, made on a non-restrictive basis with reference to the appended drawings, of which.

DETAILED DESCRIPTION OF THE PREFERRED EMBODIMENTS

Figure 1:
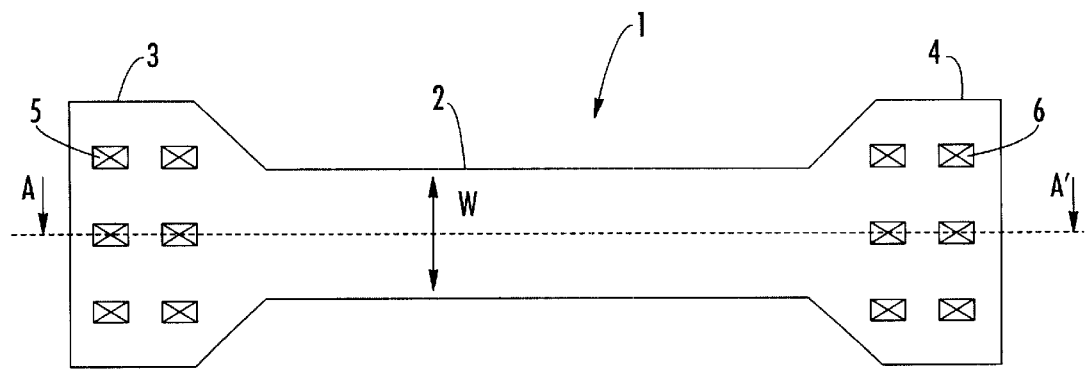
FIG. 1 is a top view of a standard fuse according to the prior art.
Figure 2:
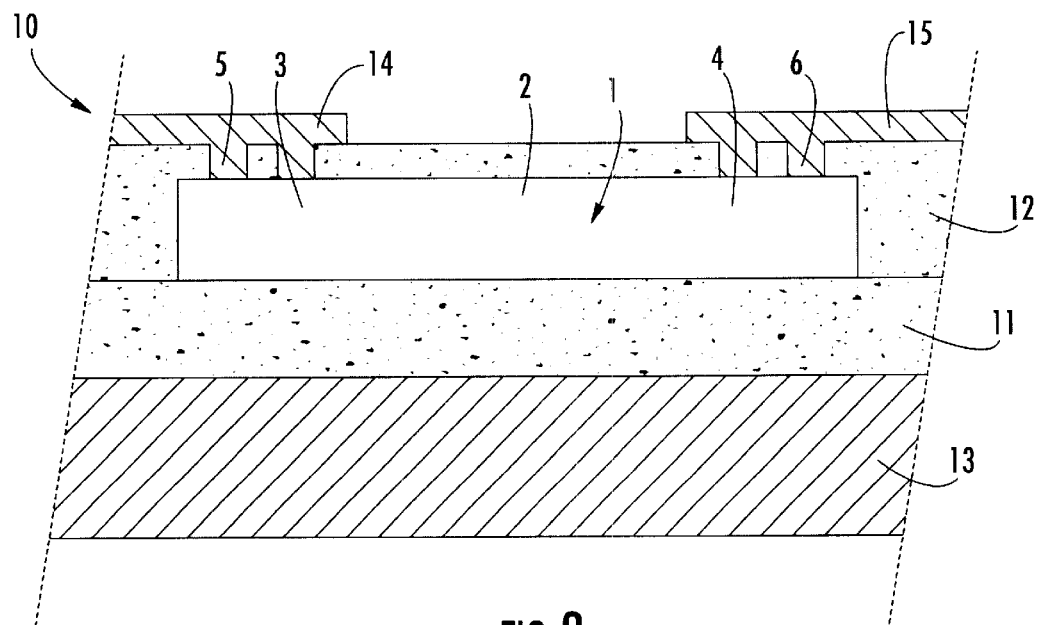
FIG. 2 is a sectional view along an axis AA' of the prior art fuse illustrated in FIG. 1 formed in an integrated circuit.
Figure 3:
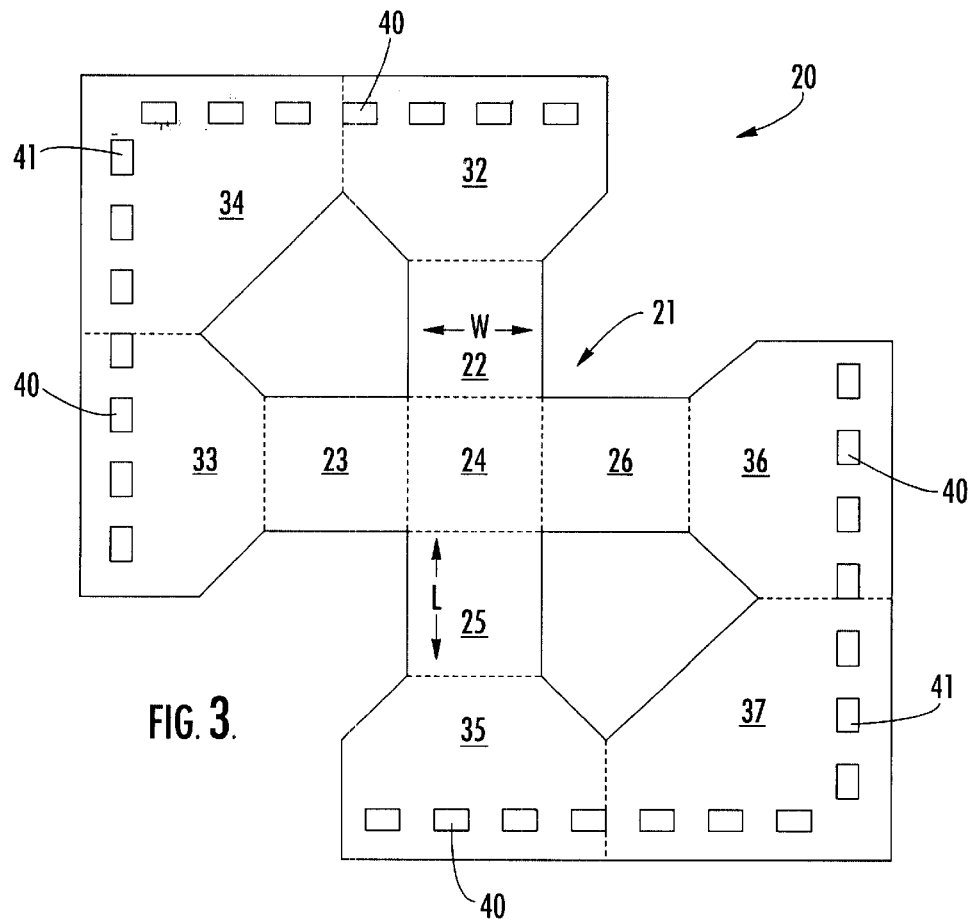
FIG. 3 is a top view of a fuse according to the present invention.

FIG. 3 shows a top view of a fuse 20 according to the present invention. Essentially, the fuse 20 can be distinguished from a standard fuse by the cross-shaped central region 21 corresponding to the placement at an angle of 90° two standard fuses which are shaped like small bars.

Thus, in the direction of flow of a fusing current, the fuse 20 includes two first conductive arms 22, 23, an intersection zone 24 where the two arms 22, 23 form no more than a single conductive element, and two second conductive arms 25, 26 positioned as a prolongation of the two first arms 22, 23. The arms 22, 23 and 25, 26 widen at their ends to respectively form zones 32, 33 and 35, 36, with each zone having a plurality of electrical contacts 40. Preferably, the zones 32, 33 and 35, 36 with the same electrical potential respectively have a common connection, i.e., respectively 34 and 37, which are also provided with a plurality of electrical contacts 41.

According to the embodiment shown in FIG. 3, the arms 22, 23 and 25, 26 are identical, and their length L is equal to their width W. The intersection zone 24 has the appearance of a square with a width W. Preferably, the width W is equal to the technological minimum or minimum width Wmin offered by the technology available for manufacturing integrated circuit fuses.

The fuse 20 according to the present invention has the combined advantages of low electrical resistance and high concentration of current in the intersection zone 24. This allows for high fusing efficiency and a low probability of regeneration.

Figure 4:
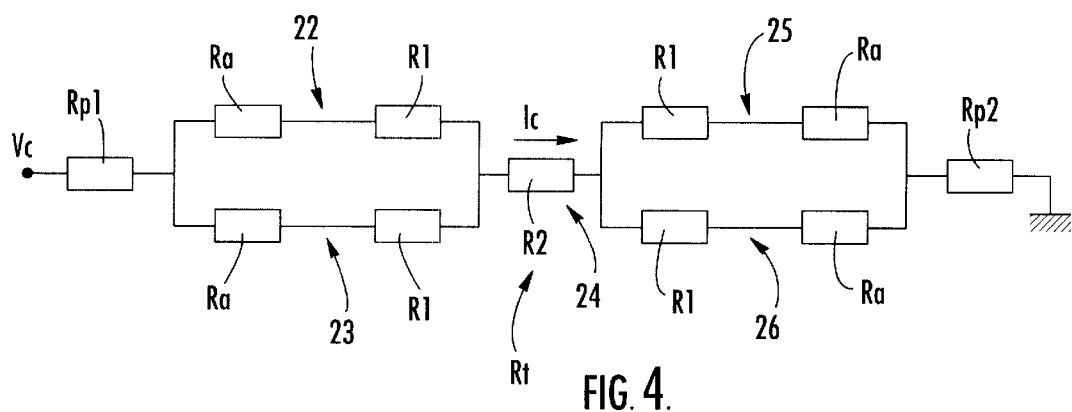
FIG. 4 is an equivalent electrical diagram of the fuse illustrated in FIG. 3.

To provide a clearer picture of these advantages, FIG. 4 shows the equivalent electrical diagram of the fuse 20. In this diagram, the resistor Rp1 represents the resistance of a first integrated circuit conductor conveying the fusing current to the fuse. The resistor Rp2 represents the resistance of a second integrated circuit conductor leading to ground. The resistance Ra represents the access resistance to one of the four ends of the central region of the fuse. The resistance Ra includes the resistance of the contacts 40 present in a zone, and the resistance of the zone itself. In one embodiment, the access resistance Ra is preferably identical for each of the zones. The resistor R1 represents the resistance of each of the arms of the fuse, and the resistor R2 represents the resistance of the intersection zone 24.

On the basis of the diagram of FIG. 4, it can be calculated that the total electrical resistance Rt of the fuse is substantially equal to:

$$Rt = Rp1 + Rp2 + Ra + R1 + R2. \quad (1)$$

Since the arms 22, 23, 25, 26 and the intersection zone 24 have the same dimension, the resistors R1 and R2 are identical and equal to the resistance per unit of surface area, or resistance per square unit R, of the material forming the fuse 20. The relationship (1) can be simplified and written as:

$$Rt = Rp1 + Rp2 + Ra + 2R. \quad (2)$$

In comparison, the total resistance Rt' of a standard fuse in the shape of a small bar having a central region with a length equal to three times its width, formed by a material with the same conductivity, is equal to:

$$Rt' = Rp1 + Rp2 + 2Ra + 3R. \quad (3)$$

Thus, with respect to a prior art fuse, the fuse 20 according to the present invention advantageously has an access resistance Ra reduced by a ratio of 1/2, and a resistance of the central region 21 reduced by a ratio of 2/3. This ratio will continue to diminish if the length of the arms 22, 23, 25, 26 are increased.

Since the resistance R of a square is generally low as compared with the total resistance Rt of the fuse 20, the fuse may be considered to be the equivalent of two parallel-connected standard fuses. Thus, for a given fusing voltage Vc, there is the benefit obtained of a greater fusing current Ic than in the prior art.

This fusing current Ic is distributed, first of all, in the two arms 22, 23 and then is concentrated in the intersection zone 24 where a very high current density is provided. The zone 24 thus forms a weak point facilitating the fusing of the fuse. More particularly, the high current concentration makes the fusing faster and more efficient, so that the fuse offers high fusing efficiency and greater reliability than a standard fuse.

The intersection zone 24 furthermore makes it possible to localize the breakdown point of the fuse, and move this point away from the zones 32 to 37 where there is a larger quantity of conductive material. According to regeneration of the fuses, this aspect of the invention is likely to contribute to obtaining a low probability of regeneration of the fuse and, therefore, improve its reliability.

However, this approach will not be taken as limiting the scope of the invention and the various embodiments that can be implemented. Thus, for example, it may be conceived that the arms 25, 26 will be shortened or even eliminated to reduce the space requirement of the fuse. In this case, the breakdown point 24 of the fuse is in the vicinity of the zones 35, 36, 37. This alternative embodiment, as well as others, is open to further studies within the scope of those skilled in the art.

In general, it is within the scope of those skilled in the art to plan for, design and compare various other structures of fuses according to the invention. For example, Y structures with 5 arms, 6 arms, etc. may be considered. It is also within the scope to study, for each structure, the optimal dimension of the arms, their arrangement, the layout and the shape of the point of concentration of the current which allows for the most efficient performance characteristics.

The fuse according to the present invention is designed to be placed in an integrated circuit, for example, between two oxide layers. The contacts 40, 41 then take the form of metallized holes that open out onto the conductors. Apart from the metals and alloys that are conventionally used in microelectronics and which lend themselves to operations of etching by photolithography (especially Al, Ti, TiN, Ri/TiN, Cu, Al/Si, Al/Cu...), the fuse can also be made by the etching of a layer of doped polysilicon that has preferably undergone silicide treatment, (for example, in the presence of titanium Ti or Co, W, Ta) for providing an improvement in its electrical conductivity.

A polysilicon fuse according to the present invention may have a thickness of 0.20 micrometers for a width W of about 0.25 micrometers for each arm 22, 23, 25, 26, and a fuse made of metal may have a thickness of 0.50 micrometers for a width W of 0.40 micrometers.

That which is claimed is:

1. An integrated circuit fuse comprising:
an electrically conductive region comprising a first pair of electrically parallel arms contacting and forming a zone of intersection for focusing a fusing current facilitating fusing of the integrated circuit fuse by increasing a current density of the fusing current, and electrical contact zones at ends of said first pair of electrically parallel arms.

2. An integrated circuit fuse according to claim 1, wherein the electrically conductive region further comprises a second pair of electrically parallel arms connected to the zone of intersection, said second pair of electrically parallel arms are respectively a prolongation of said first pair of electrically parallel arms.

3. An integrated circuit fuse according to claim 2, wherein said second pair of electrically parallel arms comprises electrical contact zones at ends of said second pair of electrically parallel arms.

4. An integrated circuit fuse according to claim 2, wherein said first pair of electrically parallel arms are substantially arranged at right angles to each other, and said second pair of electrically parallel arms are substantially arranged at right angles to each other.

5. An integrated circuit fuse according to claim 2, wherein all said first and second pair arms are substantially equal in length.

6. An integrated circuit fuse according to claim 2, wherein all said first and second pair arms are substantially equal in width.

7. An integrated circuit fuse according to claim 6, wherein the width of each arm is less than about 0.25 micrometers.

8. An integrated circuit fuse according claim 1, wherein said electrically conductive region comprises polysilicon.

9. An integrated circuit fuse according to claim 1, comprising a lower oxide layer below said electrically conductive region and an upper oxide layer above said electrically conductive region.

10. An integrated circuit fuse according to claim 9, wherein the electrical contact zones at ends of said first pair of electrically parallel arms comprises electrical contacts extending through the upper oxide layer.

11. An integrated circuit fuse comprising:
a first pair of electrically parallel arms contacting and forming a zone of intersection;
a second pair of electrically parallel arms connected to the zone of intersection; and
electrical contact zones at ends of said first and second pairs of electrically parallel arms.

12. An integrated circuit fuse according to claim 11, wherein said second pair of electrically parallel arms are respectively a prolongation of said first pair of electrically parallel arms.

13. An integrated circuit fuse according to claim 11, wherein said first pair of electrically parallel arms are substantially arranged at right angles to each other, and said a second pair of electrically parallel arms are substantially arranged at right angles to each other.

14. An integrated circuit fuse according to claim 11, wherein all said first and second pair arms are substantially equal in length.

15. An integrated circuit fuse according to claim 11, wherein all said first and second pair arms are substantially equal in width.

16. An integrated circuit fuse according to claim 15, wherein the width of each arm is less than about 0.25 micrometers.

17. An integrated circuit fuse according claim 11, wherein said electrically conductive region comprises polysilicon.

18. An integrated circuit fuse according to claim 11, comprising a lower oxide layer below said electrically conductive region and an upper oxide layer above said electrically conductive region.

19. An integrated circuit fuse according to claim 18, wherein the electrical contact zones at ends of said first and second pairs of electrically parallel arms comprises electrical contacts extending through the upper oxide layer.

* * * * *